US008003979B2

(12) United States Patent
Cho et al.

(10) Patent No.: US 8,003,979 B2
(45) Date of Patent: Aug. 23, 2011

(54) HIGH DENSITY COUPLING OF QUANTUM DOTS TO CARBON NANOTUBE SURFACE FOR EFFICIENT PHOTODETECTION

(75) Inventors: Namchul Cho, Daejeon (KR); Kaushik Roy Choudhury, Gainesville, FL (US); Yudhisthira Sahoo, Amherst, NY (US); Kwang Sup Lee, Daejeon (KR); Paras N. Prasad, Williamsville, NY (US)

(73) Assignee: The Research Foundation of State University of New York, Amherst, NY (US)

( * ) Notice: Subject to any disclaimer, the term of this patent is extended or adjusted under 35 U.S.C. 154(b) by 1009 days.

(21) Appl. No.: 11/673,850

(22) Filed: Feb. 12, 2007

(65) Prior Publication Data

US 2010/0025662 A1    Feb. 4, 2010

Related U.S. Application Data

(60) Provisional application No. 60/772,175, filed on Feb. 10, 2006.

(51) Int. Cl.
*H01L 51/46* (2006.01)
*D01F 9/12* (2006.01)

(52) U.S. Cl. .............. 257/40; 257/E51.039; 423/445 B; 977/745; 977/847

(58) Field of Classification Search .................... 257/40, 257/E51.026, E51.038–E51.04; 423/447.1–447.3, 423/445 B; 977/742, 745–749, 847–848
See application file for complete search history.

(56) References Cited

U.S. PATENT DOCUMENTS

| | | | |
|---|---|---|---|
| 6,782,021 B2 | 8/2004 | Huang et al. | |
| 6,794,265 B2 | 9/2004 | Lee et al. | |
| 6,878,871 B2 | 4/2005 | Scher et al. | |
| 6,961,499 B2 | 11/2005 | Lee et al. | |
| 7,065,285 B2 | 6/2006 | Chen et al. | |
| 7,068,898 B2 | 6/2006 | Buretea et al. | |
| 7,670,831 B2 * | 3/2010 | Lee et al. | 435/283.1 |
| 2003/0189749 A1 | 10/2003 | Morrison et al. | |
| 2004/0232388 A1 | 11/2004 | Zhang | |
| 2005/0022726 A1* | 2/2005 | Wong et al. | 117/105 |
| 2005/0045867 A1* | 3/2005 | Ozkan et al. | 257/12 |
| 2005/0136483 A1 | 6/2005 | Carlson | |

OTHER PUBLICATIONS

Landi, B.J., et al. "CdSe Quantum Dot-Single Wall Carbon Nanotube Complexes for Polymeric Solar Cells." Sol. Ener. Mat. & Sol. Cells, vol. 87 (2005): pp. 733-746.*

(Continued)

*Primary Examiner* — Matthew W Such
(74) *Attorney, Agent, or Firm* — LeClairRyan

(57) ABSTRACT

The present invention relates to a method of preparing a carbon nanotube-quantum dot conjugate having a high density of quantum dots (QDs) on its surface. This method involves providing a plurality of semiconductor quantum dots and providing a thiol-functionalized carbon nanotube having a plurality of terminal thiol groups on its surface. The plurality of semiconductor quantum dots are attached to the surface of the carbon nanotube under conditions effective to yield a carbon nanotube-quantum dot conjugate having a high density of quantum dots on its surface. The present invention also relates to a carbon nanotube-quantum dot conjugate having a high density of quantum dots on its surface. The present invention further relates to a photodetector device. This device includes a substrate and a nanocomposite layer. The nanocomposite layer includes a plurality of the carbon nanotube-quantum dot conjugates previously described.

32 Claims, 8 Drawing Sheets

Scheme 2

OTHER PUBLICATIONS

Azamian, B.R., et al. "Directly Observed Covalent Coupling of Quantum Dots to Single-Wall Carbon Nanotubes." Chem. Commun. (2002): pp. 366-367.*

Kwong, C.Y., et al. "Poly(3-henylthiophene):TiO2 Nanocomposites for Solar Cell Applications." Nanotech., vol. 15 (2004): pp. 1156-1161.*

Wang, Y. & Suna, A. "Fullerenes in Photoconductive Polymers. Charge Generation and Charge Transport." J. Phys. Chem. B, vol. 101 (1997): pp. 5627-5638.*

Xue, J. et al. "4.2% Efficient Organic Photovoltaic Cells with Low Series Resistances." Appl. Phys. Lett., vol. 84 (2004): pp. 3013-3015.*

Haremza, J.M., et al. "Attachment of Single CdSe Nanocrystals to Individual Single-Walled Carbon Nanotubes." Nanolett., vol. 2 (2002): pp. 1253-1258.*

Liu, J., et al. "Fullerene Pipes." Science, vol. 280 (1998): pp. 1253-1256.*

Ravindran, S., et al. "Covalent Coupling of Quantum Dots to Multiwalled Carbon Nanotubes for Electronic Device Applications." Nanolett., vol. 3 (2003): pp. 447-453.*

Chopra, N., et al. "Bifunctional Carbon Nanotubes by Sidewall Protection." Adv. Funct. Mater., vol. 15 (2005): pp. 858-864.*

Banerjee, S. & Wong, S.S. "Synthesis and Characterization of Carbon Nanotube-Nanocrystal Heterostructures." Nanolett., vol. 2, No. 3 (2002): pp. 195-200.*

Chu et al., "Efficient Photovoltaic Energy Conversion in Tetracene-C60 Based Heterojunctions," Appl. Phys. Lett. 86:243506-1-2435406-3 (2005).

Kreupl et al., "Carbon Nanotubes for Interconnect Applications," Electron Devices Meeting 2004, IEDM Technical Digest 683-6 (2004).

Sun et al., "Photovoltaic Devices Using Blends of Branched CdSe Nanoparticles and Conjugated Polymers," Nano Lett. 3(7):961-3 (2003).

TDA Research, Inc., "Intrinsically Conducting Polymers," http://www.tda.com/eMatls/icp.htm (last accessed Feb. 2, 2007).

McDonald et al., "Solution Processed PbS Quantum Dot Infrared Photodetectors and Photovoltaics," Nature Materials 4:138-42 (2005).

* cited by examiner

Scheme 1

Scheme 2

HIGH DENSITY COUPLING OF QUANTUM DOTS TO CARBON NANOTUBE SURFACE FOR EFFICIENT PHOTODETECTION

This application claims the benefit of U.S. Provisional Patent Application Ser. No. 60/772,175, filed Feb. 10, 2006, which is hereby incorporated by reference in its entirety.

The subject matter of this application was made with support from the U.S. Air Force Office of Scientific Research Grant No. F496200110358. The U.S. Government may have certain rights.

FIELD OF THE INVENTION

The present invention relates to a carbon nanotube-quantum dot conjugate having a high density of quantum dots on its surface, as well as to methods of preparing the conjugate. The present invention also relates to photodetector devices that include a nanocomposite layer containing the carbon nanotube-quantum dot conjugates.

BACKGROUND OF THE INVENTION

Polymeric nanocomposites have demonstrated great potential for constructing physically flexible large area optoelectronic devices that can remain photo-active over a wide spectral bandwidth, depending on the customizable constituents. They bolster the prospect of developing ultra fast, sensitive and superior optical counterparts of the corresponding electronic devices. With the successful integration of inorganic quantum dots (QDs) in conjugated polymeric matrices (Greenham et al., *Phys. Rev. B.* 54:17628 (1996); Ginger et al., *Phys. Rev. B.* 59:10622 (1999); Huynh et al., *Science* 295:2425 (2002); and Selmarten et al., *J. Phys. Chem. B.* 109:15927 (2005)), efficient photodetection at different ranges of the electromagnetic spectrum has been realized (Qi et al., *Appl. Phys. Lett.* 86:093103 (2005); McDonald et al., *Nat. Mater.* 4:138 (2005); Maria et al., *Appl. Phys. Lett.* 87:213112 (2005); and Choudhury et al., *Adv. Funct. Mater* 15:751 (2005)). This is enabled by the occurrence of tunable optical absorption and emission of the QDs (Steckel et al., *Adv. Mater.* 15:1862 (2003); and Bakueva et al., *Appl. Phys. Lett.* 82:2895 (2003)) by virtue of quantum size effect and also by the fact that they can often preserve their optoelectronic integrity within a host matrix. The quantum dots should have appreciable absorption cross-section at the excitation wavelength in order to generate excitons with good quantum efficiency (Ellingson et al., *Nano Lett.* 5:865 (2005)). The photogenerated excitons should disintegrate into free charge carriers at a competitively higher rate than excitonic recombination. Next, these charge carriers should be extracted from the photoconverter before they relax. To realize efficient photon conversion, the rates of photogenerated carrier separation, interfacial transfer across the different contacts, their transport through the matrix and subsequent collection at the electrodes must all be fast enough compared to exciton recombination (Nozik, A. J., *Inorg. Chem.* 44:6893 (2005)). Therefore, it is imperative to provide means within the nanocomposite for an efficient transport of charges by incorporating compatible constituents that would facilitate the process.

In studying photoconducting devices using conjugated polymers, electron accepting materials such as C60 and single-wall carbon nanotube (SWNT) have been utilized in some of the past studies (Yu et al., *Science* 270:1789 (1995); Halls et al., *Appl. Phys. Lett.* 68:3120 (1996); Neupane et al., *Appl. Phys. Lett.* 86:221908 (2005); Rahman et al., *J. Am. Chem. Soc.* 127:10051 (2005); and Kymakis et al., *J. Appl. Phys.* 93:1764 (2003)). SWNT is a fascinating material for several peculiar physical properties. Envisioned as a rolled up graphene sheet capped with fullerene like structures, it becomes a metal or a semiconductor as a function of the wrapping angle of the sheet and diameter of the nanotube (Yu et al., *Science* 270:1789 (1995); Halls et al., *Appl. Phys. Lett.* 68:3120 (1996); Neupane et al., *Appl. Phys. Lett.* 86:221908 (2005); Rahman et al., *J. Am. Chem. Soc.* 127:10051 (2005); Kymakis et al., *J. Appl. Phys.* 93:1764 (2003); and Odom et al., *Nature* 391:62 (1998)). In the metallic state (Frank et al., *Science* 280:1744 (1998); Bachtold et al., *Phys. Rev. Lett.* 84:6082 (2000); and Thess et al., *Science* 273:483 (1996)), SWNT is a good ballistic conductor with a supported current density at least an order of magnitude higher than that in copper wires of the same diameter (Kreupl et al., *Condensed Matter,* 0412537:683 (2004); and Kreupl et al., *Microelectronic Engineering* 64:399 (2002)). Because of its good mechanical property, high elastic modulus and high optical transparency, SWNT has been used in constructing large area transmissive films (Wu et al., *Science* 305:1273 (2004)), making it an ideal component for electrical coupling in futuristic photonic devices.

Carbon nanotubes have been extensively studied for their peculiar structure-dependent mechanical and electronic properties. High elastic modulus and optical transparency, extremely high aspect ratios, large surface area, and excellent transport properties have prompted their use in transistors, fuel-cells, molecular computers and light-harvesting assemblies. Recent studies have proven that metallic SWNTs can act as ballistic conductors carrying current densities that are orders of magnitude larger than copper wires of same diameter. Colloidal semiconductor quantum dots, on the other hand, are nanometer sized inorganic particles possessing size-tunable electronic and optical properties by virtue of quantum confinement of the photoexcited excitons. Due to the precise wavelength tuning (for both absorption and emission), high photogeneration efficiency, and resistance to photobleaching, semiconductor QDs show great promise for futuristic photonic applications, such as hybrid optoelectronic devices, in vivo biosensing and solar cells. Despite their immense potential, the efficiencies of hybrid polymer-QD devices fall short by almost an order of magnitude compared to their conventional inorganic counterparts. The primary reason for the relative inefficiency of the QD devices is the inefficient transfer of charge carriers to and from the photosensitive QDs constituting the device.

The present invention is directed to overcoming these and other deficiencies in the art.

SUMMARY OF THE INVENTION

The present invention relates to a method of preparing a carbon nanotube-quantum dot conjugate having a high density of quantum dots (QDs) on its surface. This method involves providing a plurality of semiconductor QDs. This method also involves providing a thiol-functionalized carbon nanotube. The thiol-functionalized carbon nanotube has a surface having a plurality of terminal thiol groups. This method further involves attaching the plurality of semiconductor QDs to the surface of the carbon nanotube under conditions effective to yield a carbon nanotube-quantum dot conjugate having a high density of QDs on the surface of the carbon nanotube. The present invention also relates to a carbon nanotube-quantum dot conjugate produced by this method. The present invention further relates to a photodetector device that includes a substrate and a nanocomposite layer, where the nanocomposite layer includes a plurality of the carbon nanotube-quantum dot conjugates produced by the previously described method.

The present invention also relates to a carbon nanotube-quantum dot conjugate having a high density of QDs on its surface. This conjugate includes a plurality of semiconductor QDs and a thiol-functionalized carbon nanotube having a thiol-functionalized surface. The QDs are attached to the surface of the carbon nanotube at a high density.

The present invention further relates to a photodetector device. This device includes a substrate and a nanocomposite layer. The nanocomposite layer includes a plurality of the carbon nanotube-quantum dot conjugates previously described.

Aspects of the present invention include, but are not limited to, the following: (i) an efficient method of obtaining high density attachment of QDs on the surface of carbon nanotubes such as single walled carbon nanotubes (SWNTs), yielding results better than reported in the literature; (ii) a highly scalable, low temperature, solution processible method for preparing carbon nanotube-quantum dot conjugates; (iii) a method for successful homogeneous sequestration of the resulting SWNT-QD conjugates in polymer matrices to fabricate lightweight, flexible nanostructured photoconductive devices; and (iv) means for producing highly enhanced photocurrent due to SWNT-assisted electronic transport leading to a high performance photodetector device. The present invention contemplates and describes a method of chemically bonding the QDs onto the surface of SWNTs in a very high density to yield multifunctional nano-building blocks. These SWNT-QD conjugates can be used to fabricate polymeric photoconductive devices exhibiting dramatically enhanced photodetection efficiency.

The present invention is useful in providing methods for improving the efficiency of photon conversion in QD devices. In particular, this can be achieved by providing a means of fast carrier separation and interfacial transfer and subsequent quick transport through the matrix. This can be accomplished by the chemical coupling of conducting SWNTs to semiconductor QDs. The metallic SWNT can then promote efficient charge transfer and improved transport to yield increased device efficiency. The present invention is also useful for remedying the poor control shown in the prior art over the surface coverage and degree of clustering of QDs on carbon nanotubes.

The present invention provides significant advantages over the prior art. Previous reports in the scientific literature described a general method that could produce only low yield attachment of QDs onto the surface of SWNT. This mostly relied on the affinity of the QDs to the carboxylate groups. The present invention uses the high affinity of most QDs to thiol (—SH) groups. Thus, by using a bi-linker molecule such as 2-aminoethanethiol, the SWNT surface is thiolated first before attempting to attach the QDs. This procedure has been optimized to bind a copious population of QDs that can assist in an efficient charge transfer from the QDs when excitons are generated by shining light of different excitation wavelengths where the QDs are photoactive. By choosing appropriate SWNT-QDs conjugate as a photosensitizer constituent in a polymeric composite, UV, visible, or IR region of the electromagnetic spectrum can be addressed for plastic based optoelectronics. Thus, a high quantum yield, flexible, larger area photodetector device is also contemplated by the present invention.

BRIEF DESCRIPTION OF THE DRAWINGS

FIG. 4A: TEM image of PbSe QDs; FIG. 4B: TEM image of SWNT-PbSe; FIG. 4C: High Resolution TEM (HRTEM) image of SWNT-PbSe.

DETAILED DESCRIPTION OF THE INVENTION

Figure 1:
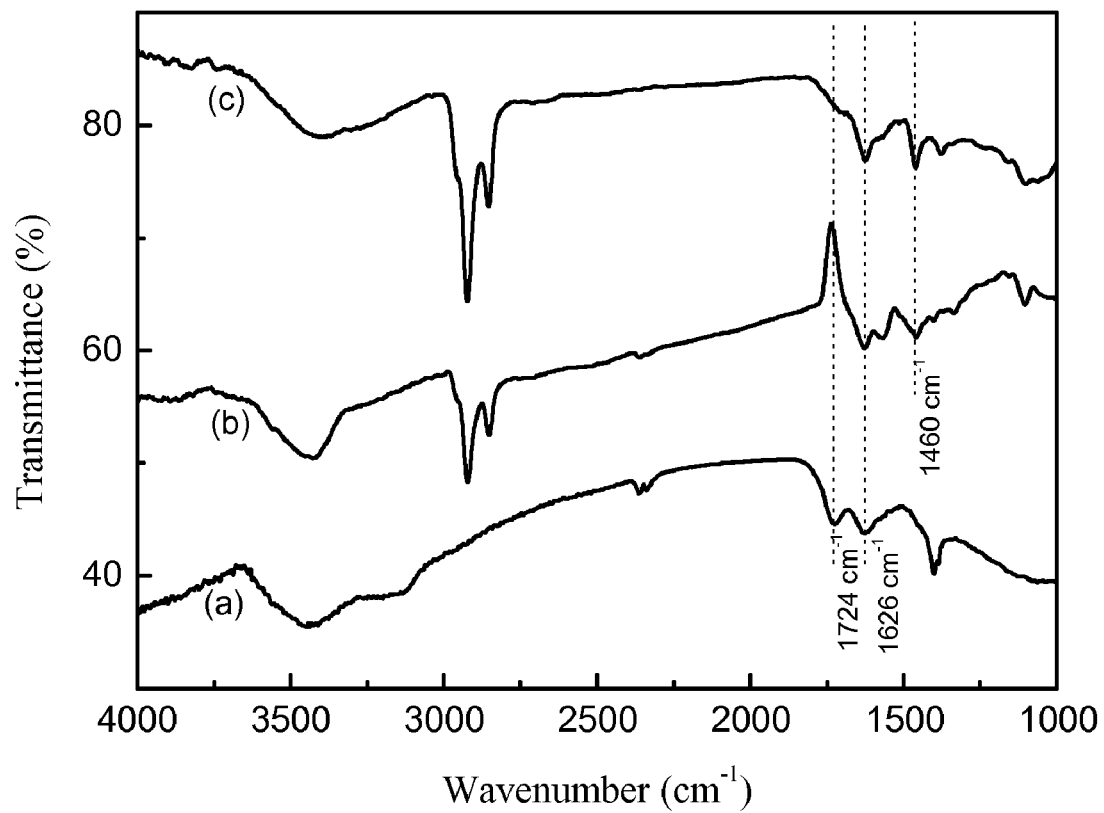
FIG. 1 is a graph showing the FT-IR spectra of (a) SWNT-COOH; (b) SWNT-SH; and (c) SWNT-PbSe.

One aspect of the present invention relates to a method of preparing a carbon nanotube-quantum dot conjugate having a high density of quantum dots (QDs) on its surface. This method involves providing a plurality of semiconductor QDs. This method also involves providing a thiol-functionalized carbon nanotube. The thiol-functionalized carbon nanotube has a surface having a plurality of terminal thiol groups. This method further involves attaching the plurality of semiconductor QDs to the surface of the carbon nanotube under conditions effective to yield a carbon nanotube-quantum dot conjugate having a high density of QDs on the surface of the carbon nanotube.

Suitable semiconductor QDs that can be used for carrying out the method of the present invention can include, without limitation, near infrared light absorbing QDs, ultraviolet light absorbing QDs, and/or visible light absorbing QDs. Particular semiconductor QDs can include those that contain semiconductor materials such as, but not limited to, the following semiconductor materials: PbSe, PbS, PbTe, ZnS, ZnSe, ZnTe, GaN, GaP, GaSb, InN, InP, InAs, InSb, CdS, CdSe, CdTe, HgS, HgSe, HgTe, AlS, AlP, AlSb, and the like. Other aspects (e.g., size and tunability) of suitable QDs for use in the present invention are described in U.S. Pat. No. 6,794,265 to Lee et al., U.S. Pat. No. 7,065,285 to Chen et al., and U.S. Pat. No. 7,068,898 to Buretea et al., which are hereby incorporated by reference in their entirety.

Suitable carbon nanotubes that can be used to carry out the method of the present invention can include, without limitation, single walled carbon nanotubes (SWNTs). In a particular embodiment, the SWNT is a metallic SWNT. Suitable SWNTs for use in the present invention are well known in the art and are commercially available. See U.S. Pat. No. 7,166,266 to Nikolaev et al.; U.S. Pat. No. 7,166,325 to Dai et al.; and U.S. Pat. No. 7,094,386 to Resasco et al., which are hereby incorporated by reference in their entirety.

In one embodiment of the method of the present invention, the step of providing the thiol-functionalized carbon nanotube involves providing a carbon nanotube having a non-functionalized surface. The non-functionalized surface of the carbon nanotube is then treated under conditions effective to yield a carboxylated carbon nanotube having a carboxylated surface. The carboxylated surface of the carboxylated carbon nanotube is then functionalized with a plurality of thiol groups under conditions effective to yield a thiol-functionalized carbon nanotube having a surface including a plurality of terminal thiol groups. Illustrative examples of means for carrying out this step of providing a thiol-functionalized carbon nanotube are described in the Examples set forth herein below.

Functionalizing the carboxylated surface of the carboxylated carbon nanotube can include, without limitation, contacting the carboxylated surface of the carboxylated carbon nanotube with a plurality of amine ligands under conditions effective to introduce a plurality of terminal thiol groups to the carboxylated carbon nanotube, thereby yielding the thiol-functionalized carbon nanotube. A suitable amine ligand can include, without limitation, 2-aminoethanethiol. However, alternative means for functionalizing the carboxylated surface of the carboxylated carbon nanotube are well known in the art by those of ordinary skill, and the present invention contemplates the use of these alternative means.

In one particular embodiment, the method of the present invention is effective in achieving a high density attachment of semiconductor QDs (e.g., PbSe QDs) onto the surface of SWNT. For example, semiconductor QDs (e.g., PbSe QDs) can be prepared by a colloidal route as a well dispersed organic solution with oleic acid as the surfactant. Their surface is stripped off a fraction of the oleic acid monolayer by washing with excess ethanol and centrifuging. In a separate reaction, SWNT is carboxylated by treating with $H_2SO_4/NO_3$ (3:1) solution in aqueous medium. N-(3-dimethylaminopropyl)-N-ethylcarbodiimide hydrochloride (EDAC) is added to the carboxylated SWNT (SWNT-COOH) in dimethylsulfoxide (DMSO) to activate the carboxyl group, followed by the addition of 2-aminoethanethiol (AET), thus effectively surface terminating the SWNT with —SH group (SWNT-SH). Excess EDAC and AET are removed by centrifuging and washing with DMSO and acetone. The precipitate is sonicated in chloroform to obtain a stable dispersion. When the SWNT-SH and partially bare surface semiconductor QDs (e.g., PbSe QDs) are stirred together for twelve hours, intimate and high density attachment of QDs occurs on the surface of SWNT. This embodiment can be used with any suitable semiconductor QD, as contemplated by the present invention.

Another aspect of the present invention is directed to a carbon nanotube-quantum dot conjugate having a high density of QDs on its surface. This conjugate includes a plurality of semiconductor QDs and a carbon nanotube having a thiol-functionalized surface. The QDs are attached to the surface of the carbon nanotube at a high density. Suitable carbon nanotubes and semiconductor QDs making up the carbon nanotube-quantum dot conjugates can include, without limitation, those carbon nanotubes and semiconductor QDs mentioned herein above in regard to the method of the present invention.

One advantage of the present invention is that it enables for high density attachment of semiconductor QDs to the surface of a carbon nanotube (e.g., an SWNT). For example, in one embodiment, the nanotube-quantum dot conjugates of the present invention can have a quantum dot surface density of between about 1.0 quantum dot particles/100 $nm^2$ and about 4.0 quantum dot particles/100 $nm^2$, particularly between about 1.25 quantum dot particles/100 $nm^2$ and about 3.0 quantum dot particles/100 $nm^2$, more particularly between about 1.50 quantum dot particles/100 $nm^2$ and about 2.5 quantum dot particles/100 $nm^2$. In another embodiment, the plurality of semiconductor QDs are monodispersed throughout the nanotube-quantum dot conjugate.

A further aspect of the present invention is directed to a photodetector device. This device includes a substrate and a nanocomposite layer. The nanocomposite layer includes a plurality of carbon nanotube-quantum dot conjugates (previously described). In one embodiment, the carbon nanotube-quantum dot conjugates are homogenously dispersed throughout the nanocomposite layer. In particular, the carbon nanotube-quantum dot conjugates can be dispersed in any semiconducting polymer known in the art for the conduction of electron holes. As used herein, the term "electron holes" (usually referred to in the art as "holes") refers to the conventional meaning of the term as used by those of ordinary skill in the art. Suitable examples of semiconducting polymers for use in the present invention include, without limitation, poly3-hexylthiophene (P3HT), polyvinylcarbazole (PVK), and poly[2-methoxy-5-(2'-ethyl-hexyloxy)-1,4-phenylene vinylene] (MEH-PPV).

Another advantage of the present invention is the effectiveness in achieving a high external quantum efficiency (EQE) in the photodector device of the present invention. For example, the photodetector device of the present invention can yield a maximum EQE of up to about 6.5 percent, particularly up to about 6.0 percent, more particularly up to about 5.0 percent, still more particularly up to about 4.0 percent. The photodetector device of the present invention is effective in detecting light over a broad spectral range, including, for example, light in the infrared spectrum, light in the ultraviolet spectrum, and light in the visible light spectrum.

Figure 5:
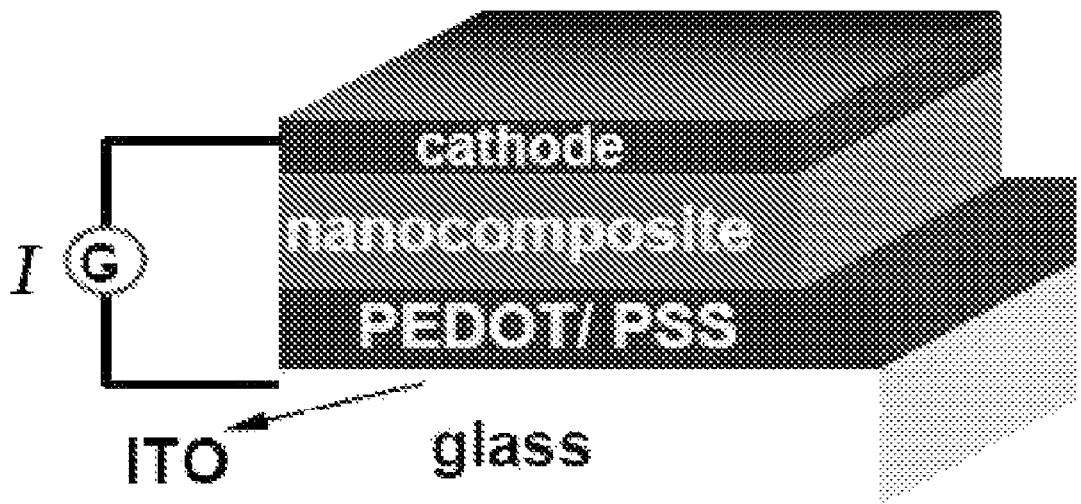
FIG. 5 is a schematic diagram of one embodiment of the device structure of an IR photodetector of the present invention.

A suitable substrate of the photodetector device of the present invention can include, without limitation, a glass substrate. In a particular embodiment, the glass substrate is coated with indium-tin-oxide (ITO). A schematic drawing of an embodiment of the photodetector device of the present invention is shown in FIG. 5. Various embodiments of the photodetector device are described below.

One embodiment of the photodetector device of the present invention can further include a charge transport layer disposed between the substrate and the nanocomposite layer. A suitable charge transport layer can include, without limitation, a conducting polymer. Suitable conducting polymers are well known by those of ordinary skill in the art. One characteristic of such suitable conducting polymers is their effectiveness in enabling efficient extraction of electron holes (see Chu et al., "Efficient Photovoltaic Energy Conversion in Tetracene-$C_{60}$ Based Heterojunctions," *Applied Physics Letters* 86:243506 (2005); and Sun et al., "Photovoltaic Devices Using Blends of Branched CdSe Nanoparticles and Conjugated Polymers," *Nano Letters* 3(7):961 (2003), which are hereby incorporated by reference in their entirety). A particular conducting polymer for use in the present invention includes, without limitation, poly(3,4-ethylenedioxythiophene) doped with poly(styrenesulfonate) (PEDOT:PSS).

In another embodiment (or as a further extension of the above embodiment), the photodetector device can include a nanocomposite layer including a plurality of carbon nanotube-quantum dot conjugates dispersed in a semiconducting polymer. Suitable semiconducting polymers for use in the present invention are those known in the art to have hole-transporting properties (e.g., conduction of holes). The skilled artisan would also be able to choose an appropriate semiconducting polymer based on considerations of energy level off-sets with respect to the other photoactive nanomaterials used in the photodetector device. A particular example of a suitable semiconducting polymer includes, without limitation, PVK. As used in the photodetector device of the present invention, the plurality of carbon nanotube-quantum dot conjugates can be homogenously dispersed in the semiconducting polymer.

In another embodiment (or as a further extension of the above embodiment), the photodetector device of the present invention can further include a cathode (e.g., Al, Ca, Mg, etc.) layer topically disposed on the nanocomposite layer. This cathode layer is effective in forming a second electrode for electron extraction.

EXAMPLES

The Examples set forth below are for illustrative purposes only and are not intended to limit, in any way, the scope of the present invention.

Example 1

Figure 7:
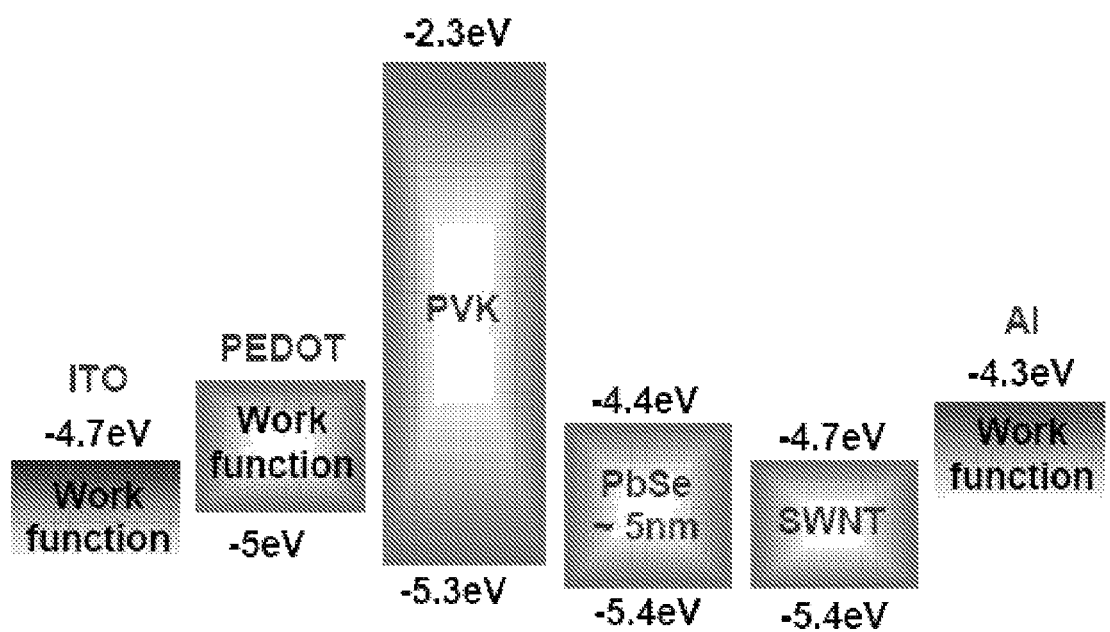
FIG. 7 is an energy band diagram for an embodiment of the composite photodector of the present invention, indicating the HOMO-LUMO levels of PVK, bulk PbSe, SWNT, and the work functions of ITO, PEDOT/PSS and Al, relative to vacuum. This represents Scheme 1, as described in the Examples section below.

Efficient Photodetection at Infrared Wavelengths by Incorporation of PbSe/Carbon Nanotube Conjugate in a Polymeric Nanocomposite The thrust of the experimental study described in Examples 1-3 was to investigate the photodetection efficiency of a polymeric nanocomposite well sequestered with the IR active PbSe QDs and conducting SWNT, both being chemically attached to each other by a novel procedure. PbSe QDs, endowed with a high Bohr radius, exhibits excellent quantum size effects, and can be tuned to a precisely targeted wavelength of absorption in the IR region. Therefore, a stable SWNT-PbSe conjugate by chemical bonding of both components can be a promising candidate for efficient optoelectronic behavior in the IR. The large interfaces in the SWNT-PbSe composite proffer a tremendous opportunity for efficient exciton dissociation after photogeneration in the PbSe QDs. Efficient dissociation and charge transfer depend on the difference in the potential energy and electron affinity of the photo-active species (PbSe QDs) and other components. As can be noted from Scheme 1 of FIG. 7, the band alignments with a higher electron affinity of SWNT, allow a non-activated electron transfer from PbSe QDs to SWNT (Kazaoui et al., *Appl. Phys. Lett.* 78:3433 (2001); and Landi et al., *Sol. Energ. Mat. Sol. Cells* 87:733 (2005), which are hereby incorporated by reference in their entirety). With the ionization potential of the polymer (i.e., PVK in this particular embodiment) (Choudhary et al., *Appl. Phys. Lett.* 84:2925 (2004), which is hereby incorporated by reference in its entirety) lying closer to vacuum than the QDs (Kohn et al., *Phys. Rev. B.* 8:1477 (1973), which is hereby incorporated by reference in its entirety), transfer of photogenerated holes to the polymer also proceeds without the necessity of any activation energy. The free carriers are transported within the composite matrix by a dc conduction process. Due to the high aspect ratio of the SWNT, even a moderate loading level in the composite is enough to establish a conducting percolation network where the ballistic transport mechanism in SWNT promotes a high electronic mobility, leading to enhanced photocurrents (Kymakis et al., *Appl. Phys. Lett.* 80:112 (2002), which is hereby incorporated by reference in its entirety).

Figure 8:
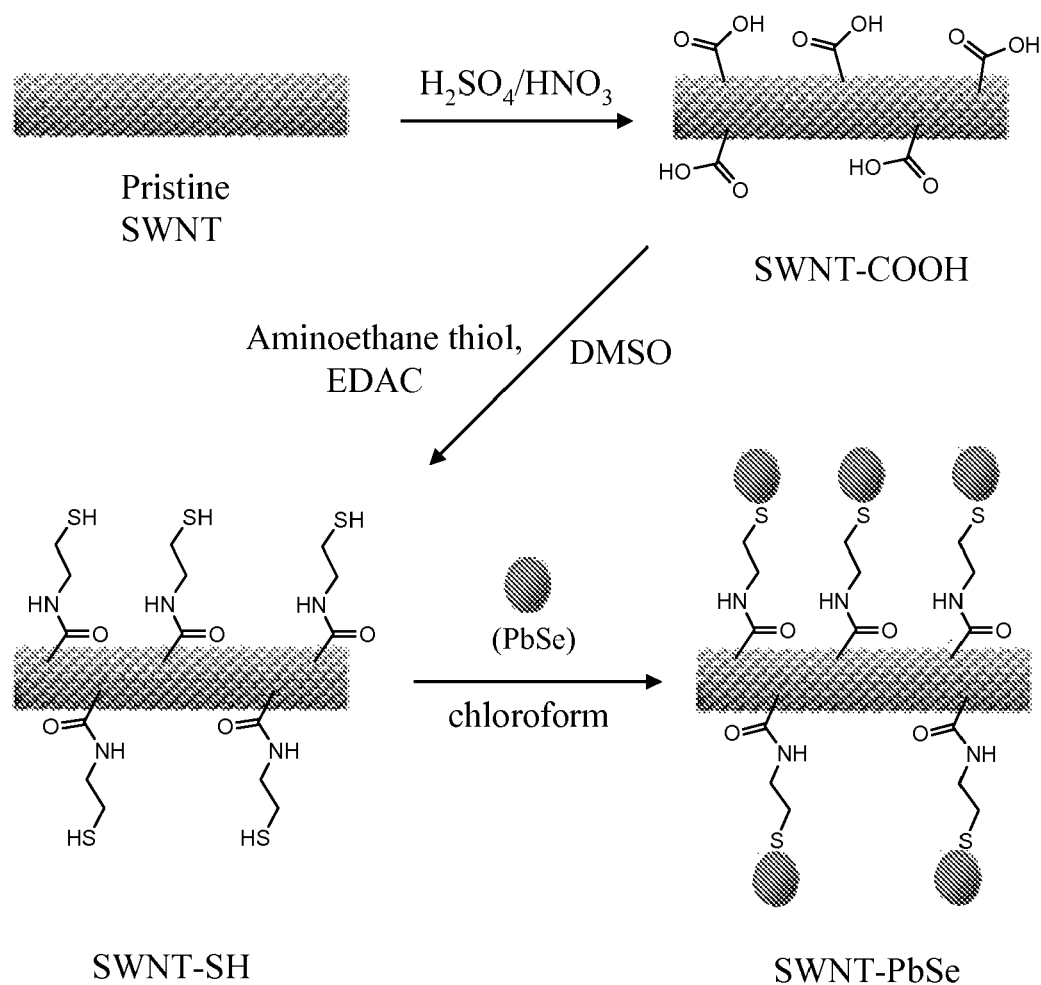
FIG. 8 is a schematic diagram showing the synthetic route for SWNT coupled with PbSe. This represents Scheme 2, as described in the Examples section below.

For an efficient charge transfer, it is desirable that PbSe QDs are attatched on the surface of SWNT intimately and in high concentration. As shown in Scheme 2 of FIG. 8, this has been achieved by a novel procedure of first thiolating the SWNT surface before adsorbing PbSe QDs. It has been found that introduction of a thiol functional group on the SWNT surface allows surface adsorption of PbSe QDs at high a density significantly higher than that reported in the literature (Liu et al., *Science* 280:1253 (1998); Banerjee et al., *Nano Lett.* 2:195 (2002); and Haremza et al., *Nano Lett.* 2:1253 (2002), which are hereby incorporated by reference in their entirety). For this purpose, the SWNT is first carboxylated and later thiolated by binding a bi-linker molecule 2-aminoethanethiol through an amide bond. The SWNT-COOH activated by N-(3-dimethylaminopropyl)-N-ethylcarbodiimide hydrochloride (EDAC) easily allows nucleophilic attack of the amine group of 2-aminoethanethiol forming an amide bond as well as resulting in a terminal thiol group on SWNT (SWNT-SH) (Schuets et al., *Adv. Funct. Mater.* 13:929 (2003), which is hereby incorporated by reference in its entirety). The attachment between SWNT-SH and PbSe QDs is maximized without compromising its colloidal stability and thus ensuring its homogeneous sequestration in the polymer.

For the structural characterization, carboxylation and thiol group functionalization for SWNT were confirmed by FT-IR studies as shown in FIG. 1. The pristine SWNT has no characteristic bands (He et al., *Biomacromolecules* 6:2455 (2005), which is hereby incorporated by reference in its entirety), but a clear C=O stretching vibration at 1724 $cm^{-1}$ appears in the carboxylated SWNT appears as seen in plot (a) of FIG. 1 (Chen et al., *Science* 282:95 (1998), which is hereby incorporated by reference in its entirety). The broad band between 3000 and 3600 $cm^{-1}$ results from O—H absorption in carboxylic acid groups. On formation of the amide bond, the carbonyl peaks for SWNT-SH and SWNT-PbSe are shifted to 1626 $cm^{-1}$ in both cases of the conjugate (plots (b) and (c) of FIG. 1). Saturated C—H stretching (around 2800~2900 $cm^{-1}$) and bending (1460 $cm^{-1}$) correspond to the alkyl group of 2-aminoethanethiol (Qin et al., *Chem. Mater.* 15:3256 (2003), which is hereby incorporated by reference in its entirety). Also, a broad absorption peak near 3400 $cm^{-1}$ is indicative of the N—H absorption in amide bond along with O—H stretching.

Figure 2:
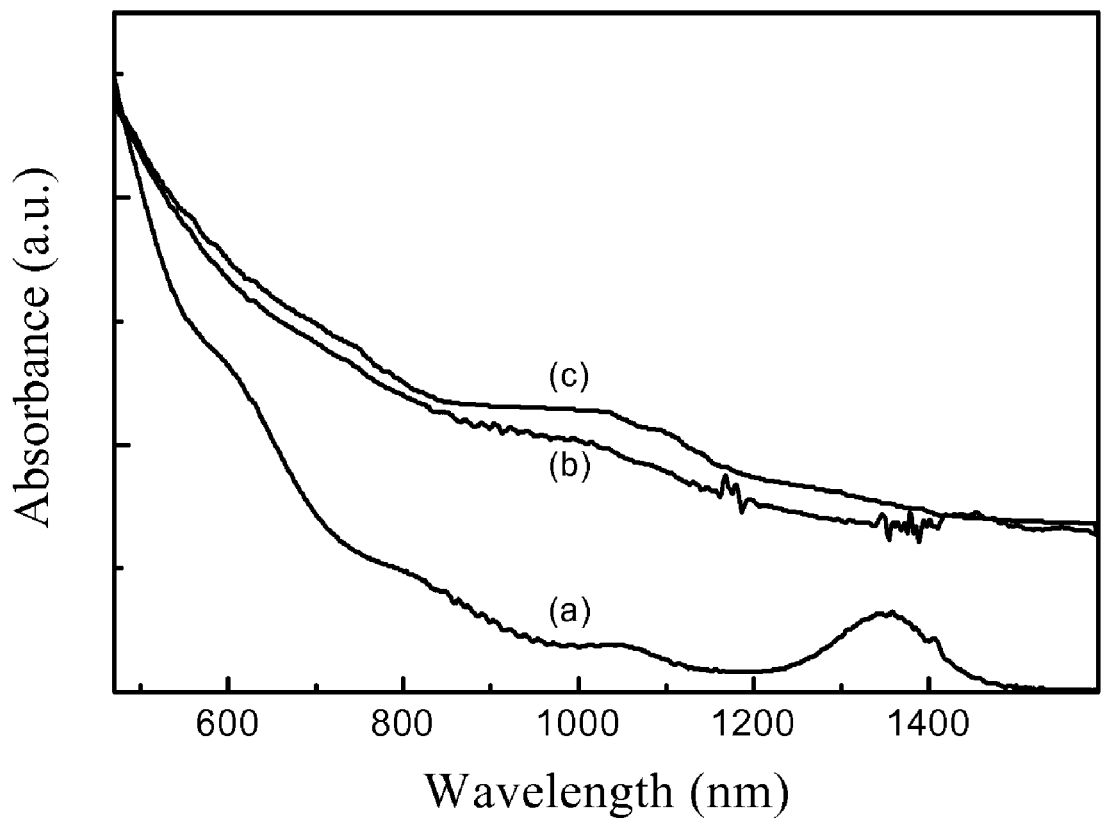
FIG. 2 is a graph showing the absorption spectra of (a) PbSe QDs; (b) SWNT-COOH; and (c) SWNT-PbSe.
Figure 3:
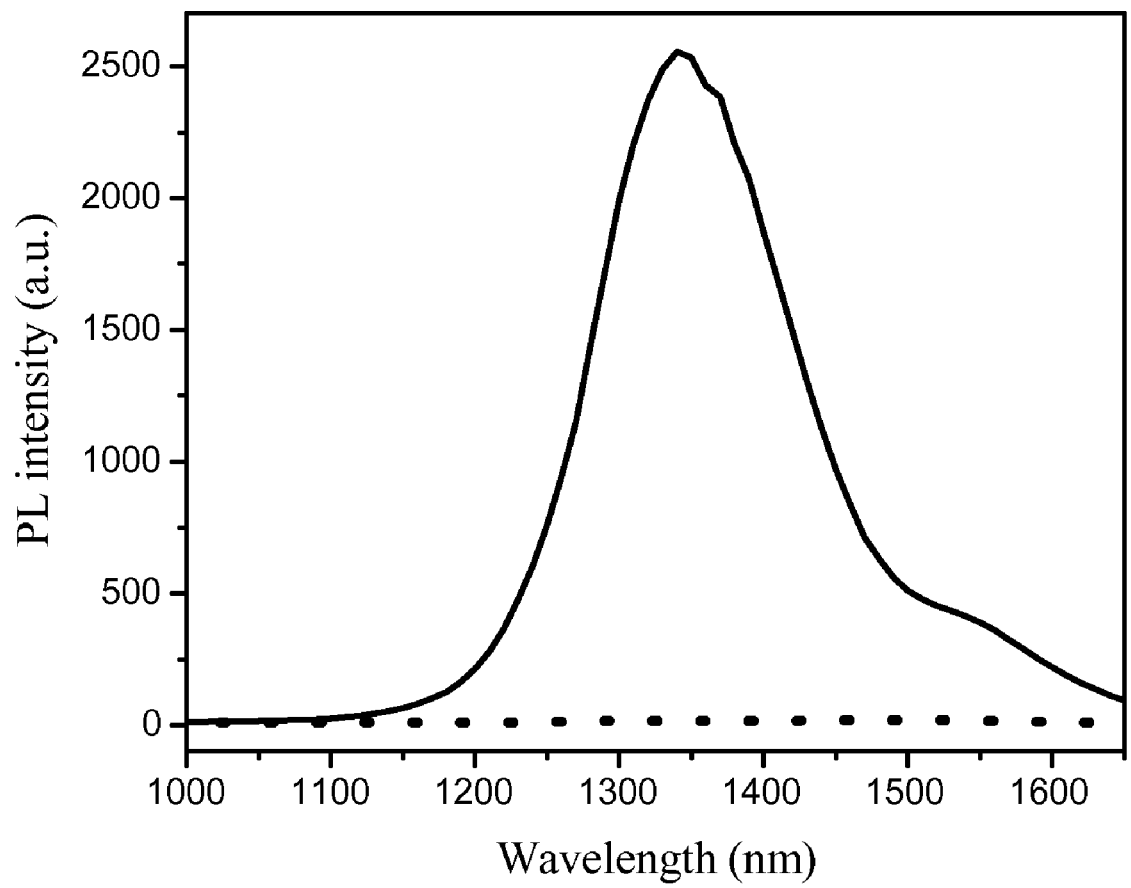
FIG. 3 is a graph showing the PL spectra of PbSe QDs (solid line) and SWNT-PbSe (dotted line) in tetracholoethylene colloidal suspensions, excited with 488 nm laser. The concentration of PbSe QDs was the same in both cases.

The absorption spectra of the PbSe aliquot shows the most prominent first excitonic transition, peaked at 1340-1350 nm with a band edge at 1464 nm corresponding to band gap $E_g=0.85$ eV, followed by the relatively weaker second and third peaks at 1050-1060 nm and 820-830 nm respectively (as shown in FIG. 2). The absorption peak of SWNT-COOH at 1000 nm is attributed to electronic transitions between electronic density of states (DOS) corresponding to van Hove singularities (Pichler et al., *Phys. Rev. Lett.* 80:4729 (1998); and Jost et al., *Appl. Phys. Lett.* 75:2217 (1999), which are hereby incorporated by reference in their entirety). Analysis of SWNT-PbSe indicates that the absorption features of PbSe are suppressed in the conjugate, though the concentration of PbSe QDs in the neat PbSe aliquot as well as that in the SWNT-PbSe conjugate was preserved. There is no significant difference between the spectra of SWNT and SWNT-PbSe conjugate (FIG. 2). Suppression of PbSe excitonic features can mean that the quantum confinement conditions for the excitons in PbSe QDs are compromised when the QDs remain in close proximity with each other and also with the SWNT, where an overlap of wave functions is highly probable. The results of photoluminescence (PL) measurements agree with this (FIG. 3). Pure PbSe nanoparticles show intense PL with a peak at around 1350 nm (solid line in FIG. 3), which corresponds to the first excitonic absorption band. A huge decrease in the PL intensity (more then 1000-fold) was observed for the SWNT-PbSe sample (dotted line in FIG. 3). A supra-assembly of QDs has been shown to exhibit a transition to an extended electronic state, analogous to Anderson transition in disordered solids, resulting in the suppression of excitonic features as observed in CdSe QDs in thin film configuration (Artemyev et al., *Phys. Stat. Sol. B.* 224:393 (2001), which is hereby incorporated by reference in its entirety). Such reasoning can partly account for a diminished PL, but it is also highly likely that an appreciable and swift electron transfer from PbSe QDs to SWNT is facilitated resulting in a dramatic decrease in the PL (FIG. 3).

Figures 4A, 4B, 4C, 4D:
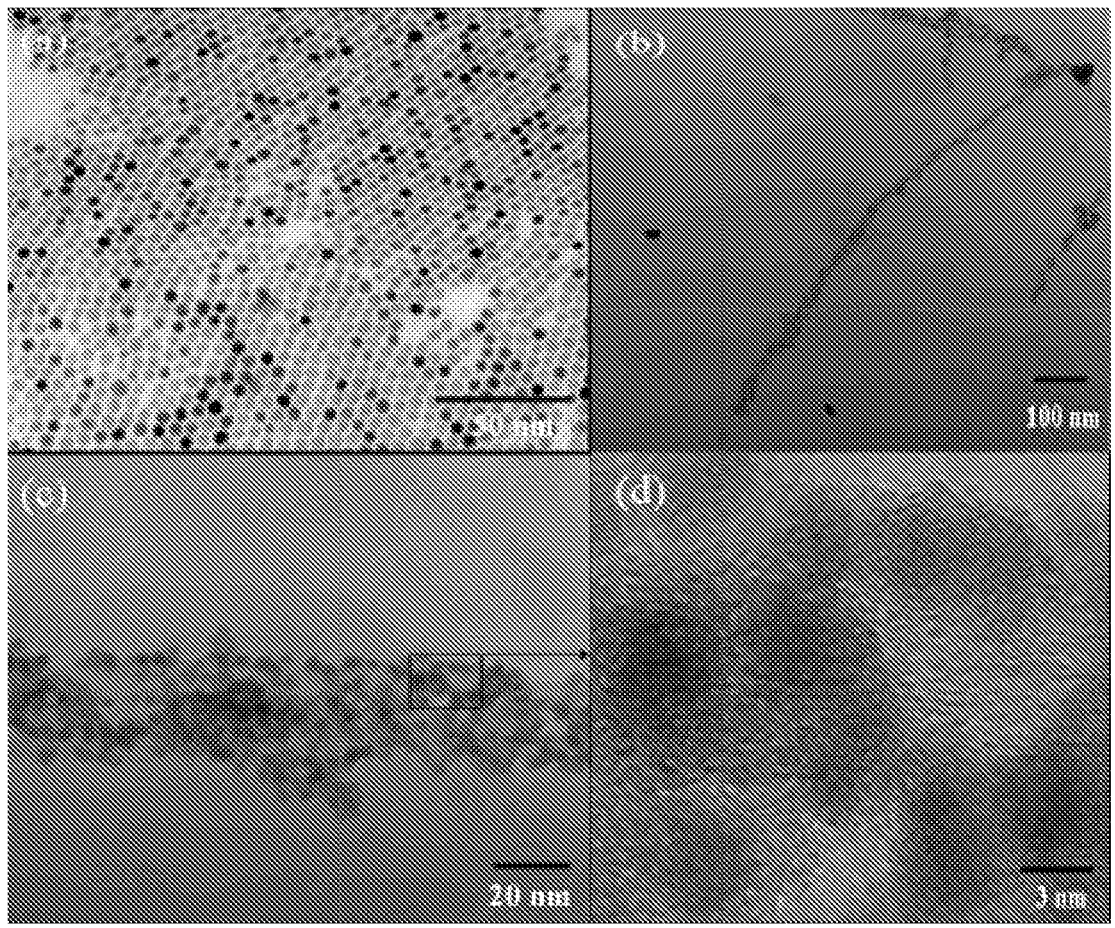
FIGS. 4A-4C are transmission electron microscope (TEM) images as follows.
FIG. 4D: Magnified HRTEM image of square area in FIG. 4C.

The PbSe QDs used in this preparation are extremely monodispersed (FIG. 4A) which orient into an ordered hexagonal superlattice when their surface is hydrophobic. Examination of TEM of the SWNT-PbSe conjugate (FIG. 4B) reveals that the PbSe QDs bind to the terminal —SH group of the SWNT well in copious population. FIGS. 4C and 4D show a zoom of a single SWNT-PbSe conjugate where the single strands of SWNT as well as the lattice fringes of PbSe are discernible.

Composite dispersion of the constituents was performed by combining appropriate proportions of PVK and SWNT-PbSe complex in chloroform, followed by homogenization via vigorous stirring and ultrasonication. Device fabrication involved the use of commercially-obtained ITO-coated glass substrates. A 50-nm-thick layer of PEDOT/PSS was spin-cast on the ITO substrate to improve the charge transport through the device. This is followed by spin-casting the active layer of the photodetector from the composite solution. The resulting samples were dried overnight in vacuum to ensure complete solvent removal. Finally, aluminum counter-electrodes were thermally evaporated through a standard shadow mask under high-vacuum to yield the sandwich device structure with active area ~0.04 $cm^2$ (FIG. 5).

Figure 6:
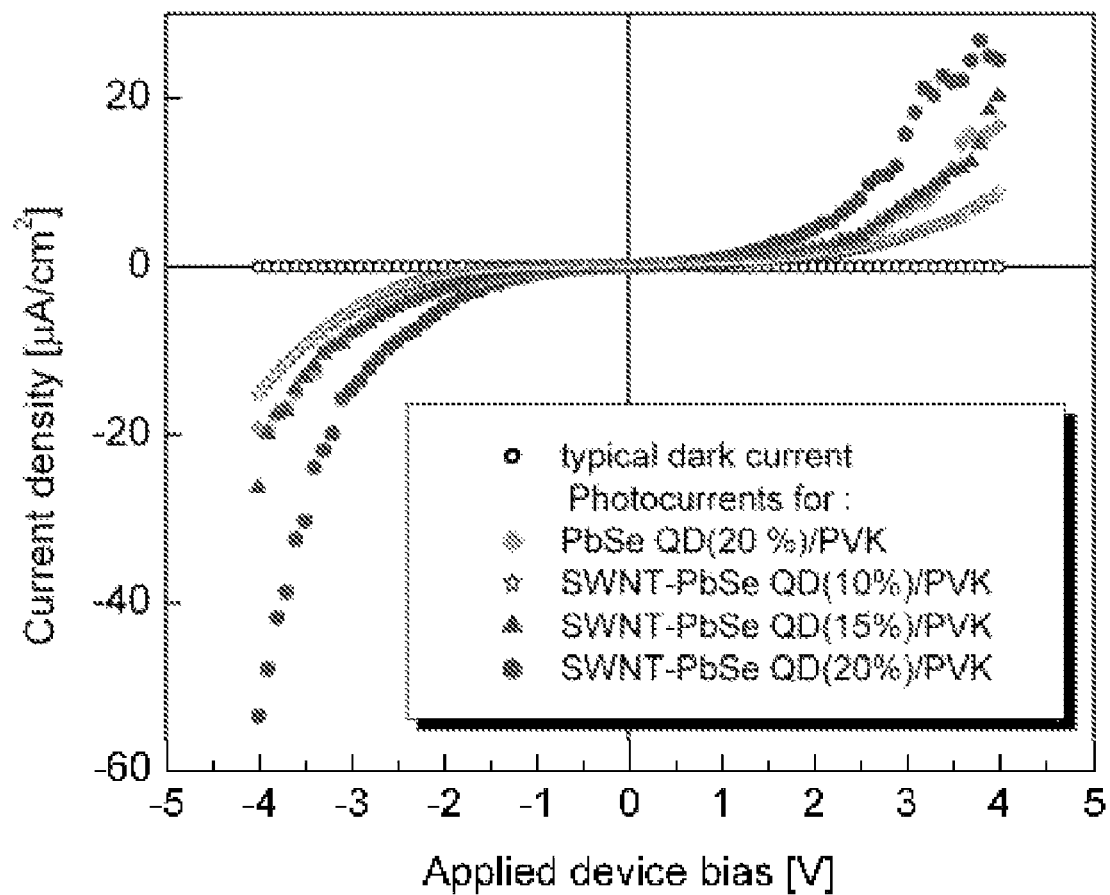
FIG. 6 us a graph showing I-V characteristics of the PbSe QD/PVK and SWNT-PbSe/PVK device in dark and under illumination.

FIG. 6 shows the measured dark currents and photocurrents in different composites. The photocurrent increases significantly in the composites containing the SWNT-PbSe complex, as compared to those containing just the QDs. For the PbSe QD/PVK composites, the photocurrent increases significantly as a function of the loading fraction of QDs, indicating quantitative infrared sensitization of the polymer by the QDs (Choudhury et al., *Appl. Phys. Lett.* 87:073110 (2005), which is hereby incorporated by reference in its entirety). FIG. 6 depicts the result with different loading wt % of QDs in the composite. It was noted that for devices containing the SWNT-PbSe conjugate, the photocurrent is larger per effective load fraction of the PbSe QDs. For example, the photocurrent at 15 wt % loading of the SWNT-PbSe conjugate surpasses that of 20% load fractions of solitary PbSe QDs. The best performance was extracted from the devices containing 20 wt % of SWNT-PbSe conjugate. The enhancement in photocurrent, compared to devices incorporating just the QDs, is more than 2 times at the highest operating bias. Dark currents are two orders of magnitude lower for all the measured devices.

The external quantum efficiency (EQE) of such photodetectors is defined as the ratio of the number of collected charges at the electrode to the number of incident photons at the wavelength of operation. Efficient harvesting of IR photons in our devices followed by fast charge transfer and enhanced conduction in the polymer and SWNT networks results in a maximum EQE of ~2.6%. Compared to the PbSe QD/PVK devices that exhibit EQE of ~1.2%, this is more than 100% increment.

The photoinduced charge generation in a nanocomposite depends on the efficient capture of the electron and hole of the photodissociated exciton before they recombine and generate photoluminescence. The experiments and experimental results of Examples 1-3 show that by incorporating SWNT-PbSe conjugate where a copious population of PbSe QDs is attached to the nanotubes, efficient charge separation and transport is achieved. The experiments of Examples 1-3 combines distinct merits of the constituents of a polymeric nanocomposite, namely high efficiency excitonic generation of PbSe QDs; efficient electron transfer to SWNT due to intimate and high density attachment of QDs; low percolation threshold dc conduction path due to SWNT; and above all the ballistic transport mechanism in SWNT-all of which lead to a stupendous enhancement of photocurrent over and above an original device without the SWNT constituent.

Example 2

Experimentals: Efficient Photodetection at Infrared Wavelengths by Incorporation of PbSe/Carbon Nanotube Conjugate in a Polymeric Nanocomposite Sample Preparation PbSe QDs were prepared as per our earlier report (Choudhury et al., *Appl. Phys. Lett.* 87:073110 (2005), which is hereby incorporated by reference in its entirety). Briefly, PbO (5 mmol) and oleic acid (25 mmol) were added to 20 mL tri-n-octyylamine. The reaction mixture was heated under alternate vacuum and argon atmosphere for 30 minutes at 155° C., when 10 mL IM selenium dissolved in tri-n-octylphosphine (TOP-Se) was rapidly injected into the reaction flask. A monodispersed crop of PbSe QDs were formed by this reaction, which could be retrieved at different size fractions. The QDs were cleaned off excess surfactant, oleic acid, and other side products by adding excess acetone to an aliquot and centrifugation.

The procedure of attaching PbSe QDs onto SWNT is given below: First, the SWNT (diam. 1.2-1.5 nm, length 2-5 μm, bundles, Aldrich, 50%) surface was carboxylated by oxidation with a mixture of $H_2SO_4/HNO_3$. SWNT (80 mg) was stirred in 40 ml of $H_2SO_4/HNO_3$ (3:1) solution for 24 h at room temperature (RT). The reaction mixture was centrifuged and washed with water several times to remove the excess acid. 160 mg of N-(3-dimethylaminopropyl)-N-ethyl-carbodiimide hydrochloride (EDAC) was added to the carboxylated SWNT (SWNT-COOH) in DMSO to activate the carboxyl group, followed by the addition of 500 mg of 2-aminoethanethiol (AET) and stirring for 12 h at room temperature. After the coupling reaction with AET, excess EDAC and AET were removed by centrifuging and washing with DMSO and acetone. The precipitate was sonicated in chloroform to obtain a stable dispersion.

The surface PbSe QDs was stripped off a fraction of the oleic acid monolayer by washing with excess ethanol and centrifuging. The QDs with partially bare surface were redispersed in chloroform and subsequently stirred with SWNT-SH. The mixture was stirred for 12 h in chloroform. Any free PbSe was separated by centrifuging with microcentrifuge filters (MWCO 100,000 Da PTHK polysulfone membrane, Aldrich) and the product SWNT-PbSe in the residue was redispersed in chloroform.

Example 3

Sample Characterization: Efficient Photodetection at Infrared Wavelengths by Incorporation of PbSe/Carbon Nanotube Conjugate in a Polymeric Nanocomposite Absorption spectra were recorded using a Shimadzu 3101PC spectrophotometer. A SPEX 270M spectrometer (Jobin Yvon) equipped with an InGaAs photodetector (Electro-Optical Systems Inc., USA) was used for acquisition of PL emission spectra. An argon ion laser (BeamLok, Spectra-Physics) (488 nm line) was used for PL excitation. Excitation power was maintained the same for every round of acquisition. The samples in quartz cuvettes were mounted directly in front of the entrance slit of the spectrometer and the exciting laser beam was directed at 90-degrees relative to the collection of emission.

FT-IR spectra of carboxylated SWNT, thiolated SWNT and SWNT-PbSe conjugates in KBr pellets were obtained. These measurements were made using a Perkin Elmer FT-IR spectrometer model 1760X operating in transmission mode. Transmission Electron Microscopy (TEM) images were obtained with a model 200 JEOL microscope at an acceleration voltage of 200 kV. The specimens were prepared by drop casting a dispersion of the sample onto an amorphous carbon coated 300 mesh copper grid.

I-V Characterization:

The current-voltage characteristics in dark and under illumination were measured with a Keithley Sourcemeter interfaced with Labview software for data acquisition. The devices were optically excited by a continuous-wave semiconductor laser operating at 1340 nm.

Although preferred embodiments have been depicted and described in detail herein, it will be apparent to those skilled in the relevant art that various modifications, additions, substitutions, and the like can be made without departing from the spirit of the invention and these are therefore considered to be within the scope of the invention as defined in the claims which follow.

What is claimed:

1. A method of preparing a carbon nanotube-quantum dot conjugate, said method comprising:
    providing a plurality of semiconductor quantum dots;
    providing a thiol-functionalized carbon nanotube, wherein said thiol-functionalized carbon nanotube has a surface comprising a plurality of terminal thiol groups; and
    attaching the plurality of semiconductor quantum dots to the surface of the carbon nanotube under conditions which yield a carbon nanotube-quantum dot conjugate having a density of quantum dots on the surface of the carbon nanotube of between about 1.0 quantum dot particles/100 nm$^2$ and about 4.0 quantum dot particles/100 nm$^2$.

2. The method according to claim 1, wherein the semiconductor quantum dots are selected from the group consisting of near infrared light absorbing quantum dots, ultraviolet light absorbing quantum dots, and visible light absorbing quantum dots.

3. The method according to claim 1, wherein the semiconductor quantum dots comprise a semiconductor material selected from the group consisting of PbSe, PbS, PbTe, ZnS, ZnSe, ZnTe, GaN, GaP, GaSb, InN, InP, InAs, InSb, CdS, CdSe, CdTe, HgS, HgSe, HgTe, AlS, AlP, and AlSb.

4. The method according to claim 1, wherein the carbon nanotube comprises a single walled carbon nanotube.

5. The method according to claim 4, wherein the single walled carbon nanotube is a metallic single walled carbon nanotube.

6. The method according to claim 1, wherein said providing a thiol-functionalized carbon nanotube comprises:
    providing a carbon nanotube having a non-functionalized surface;
    treating the non-functionalized surface of the carbon nanotube under conditions effective to yield a carboxylated carbon nanotube having a carboxylated surface; and
    functionalizing the carboxylated surface of the carboxylated carbon nanotube with a plurality of thiol groups under conditions effective to yield a thiol-functionalized carbon nanotube having a surface comprising a plurality of terminal thiol groups.

7. The method according to claim 6, wherein said functionalizing the carboxylated surface of the carboxylated carbon nanotube comprises:
    contacting the carboxylated surface of the carboxylated carbon nanotube with a plurality of amine ligands under conditions effective to introduce a plurality of terminal thiol groups to the carboxylated carbon nanotube, thereby yielding the thiol-functionalized carbon nanotube.

8. The method according to claim 7, wherein the plurality of amine ligands comprise 2-aminoethanethiol.

9. The method according to claim 1, wherein the carbon nanotube-quantum dot conjugate has a quantum dot surface density of between about 1.25 quantum dot particles/100 nm$^2$ and about 3.0 quantum dot particles/100 nm$^2$.

10. The method according to claim 1, wherein the plurality of semiconductor quantum dots are monodispersed throughout the nanotube-quantum dot conjugate.

11. A carbon nanotube-quantum dot conjugate produced according to the method of claim 1.

12. A photodetector device comprising:
    a substrate and
    a nanocomposite layer comprising a plurality of carbon nanotube-quantum dot conjugates according to claim 11.

13. A carbon nanotube-quantum dot conjugate comprising:
    a plurality of semiconductor quantum dots and a carbon nanotube having a thiol-functionalized surface, wherein said quantum dots are attached to said surface at a density of between about 1.0 quantum dot particles/100 nm$^2$ and about 4.0 quantum dot particles/100 nm$^2$.

14. The conjugate according to claim 13, wherein the semiconductor quantum dots are selected from the group consisting of near infrared light absorbing quantum dots, ultraviolet light absorbing quantum dots, and visible light absorbing quantum dots.

15. The conjugate according to claim 13, wherein the semiconductor quantum dots comprise a semiconductor material selected from the group consisting of PbSe, PbS, PbTe, ZnS, ZnSe, ZnTe, GaN, GaP, GaSb, InN, InP, InAs, InSb, CdS, CdSe, CdTe, HgS, HgSe, HgTe, AlS, AlP, and AlSb.

16. The conjugate according to claim 14, wherein the carbon nanotube comprises a single walled carbon nanotube.

17. The conjugate according to claim 16, wherein the single walled carbon nanotube is a metallic single walled carbon nanotube.

18. The conjugate according to claim 13, wherein the conjugate has a quantum dot surface density of between about 1.25 quantum dot particles/100 nm$^2$ and about 3.0 quantum dot particles/100 nm$^2$.

19. The conjugate according to claim 13, wherein the plurality of semiconductor quantum dots are monodispersed throughout the conjugate.

20. A photodetector device comprising:
    a substrate and
    a nanocomposite layer comprising a plurality of carbon nanotube-quantum dot conjugates according to claim 13.

21. The photodetector device according to claim 20, wherein the substrate comprises a glass substrate.

22. The photodetector device according to claim 21, wherein the glass substrate is coated with indium-tin-oxide.

23. The photodetector device according to claim 20 further comprising:

a charge transport layer disposed between the substrate and the nanocomposite layer, wherein said charge transport layer is effective to enable efficient extraction of holes.

24. The photodetector device according to claim 23, wherein the charge transport layer comprises a conducting polymer.

25. The photodetector device according to claim 24, wherein said conducting polymer comprises poly(3,4-ethylenedioxythiophene) doped with poly(styrenesulfonate).

26. The photodetector device according to claim 20, wherein the plurality of carbon nanotube-quantum dot conjugates are homogenously dispersed in a semiconducting polymer.

27. The photodetector device according to claim 26, wherein the semiconducting polymer comprises polyvinylcarbazole.

28. The photodetector device according to claim 20 further comprising:

a cathode layer topically disposed on the nanocomposite layer.

29. The photodetector device according to claim 20, wherein said device yields a maximum external quantum efficiency of up to about 6.5 percent.

30. The photodetector device according to claim 20, wherein said device detects light in the infrared spectrum.

31. The photodetector device according to claim 20, wherein said device detects light in the ultraviolet spectrum.

32. The photodetector device according to claim 20, wherein said device detects light in the visible light spectrum.

* * * * *